United States Patent
Bains et al.

(10) Patent No.: US 9,355,688 B2
(45) Date of Patent: May 31, 2016

(54) ADAPTIVE VOLTAGE INPUT TO A CHARGE PUMP

(75) Inventors: Kuljit Bains, Olympia, WA (US); George Vergis, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 114 days.

(21) Appl. No.: 13/976,791

(22) PCT Filed: May 8, 2012

(86) PCT No.: PCT/US2012/036969
§ 371 (c)(1),
(2), (4) Date: Jun. 27, 2013

(87) PCT Pub. No.: WO2013/169235
PCT Pub. Date: Nov. 14, 2013

(65) Prior Publication Data
US 2014/0192607 A1    Jul. 10, 2014

(51) Int. Cl.
*G05F 1/10* (2006.01)
*G11C 5/14* (2006.01)
*G11C 11/4074* (2006.01)
*G11C 29/02* (2006.01)

(52) U.S. Cl.
CPC ............ *G11C 5/145* (2013.01); *G11C 11/4074* (2013.01); *G11C 29/021* (2013.01); *G11C 29/028* (2013.01)

(58) Field of Classification Search
CPC ........ H02M 3/07; H02M 3/073; G11C 5/145; G11C 11/4074; G11C 29/028
USPC ........... 327/537, 536, 538; 315/291; 365/228, 365/226
See application file for complete search history.

(56) References Cited

U.S. PATENT DOCUMENTS

| | | | |
|---|---|---|---|
| 5,828,620 A * | 10/1998 | Foss et al. | 365/226 |
| 5,838,189 A | 11/1998 | Jeon | |
| 7,432,731 B2 | 10/2008 | Bains et al. | |
| 7,515,488 B2 * | 4/2009 | Thorp et al. | 365/189.09 |
| 7,595,682 B2 * | 9/2009 | Lin et al. | 327/536 |
| 7,663,934 B2 | 2/2010 | Ha | |
| 8,040,175 B2 * | 10/2011 | Raghavan | 327/536 |
| 8,649,229 B2 | 2/2014 | Vergis | |
| 2006/0186947 A1 * | 8/2006 | Lin et al. | 327/536 |
| 2008/0239856 A1 * | 10/2008 | Thorp et al. | 365/226 |
| 2012/0139620 A1 * | 6/2012 | Raghavan | 327/536 |

FOREIGN PATENT DOCUMENTS

KR    10-1999-0002891    1/1999

OTHER PUBLICATIONS

International Search Report and Written Opinion from PCT/US2012/036969 mailed Jan. 2, 2013, 9 pages.
Office Action and Taiwan Search Report from foreign counterpart Taiwan Patent Application No. 102112157, mailed Mar. 20, 2015, 11 pages.
International Preliminary Report on Patentability and Written Opinion from PCT/US2012/036969 mailed Nov. 20, 2014, 6pages.

* cited by examiner

*Primary Examiner* — Han Yang
*Assistant Examiner* — Xiaochun L Chen
(74) *Attorney, Agent, or Firm* — Blakely, Sokoloff, Taylor & Zafman LLP

(57) ABSTRACT

A memory subsystem includes an adaptive output voltage to provide a voltage based on a power profile of a memory device of the memory subsystem. A charge pump increases the voltage to a level needed to write data to the memory device. The voltage provided is based on the power profile of the memory device, which indicates a voltage level that provides good efficiency for the charge pump, and is within maximum levels for the memory device. The voltage can be higher than a nominal voltage indicated for the memory device in a specification.

22 Claims, 4 Drawing Sheets

ADAPTIVE VOLTAGE INPUT TO A CHARGE PUMP

This application is a U.S. National Phase application under 35 U.S.C. §371 of International Application No. PCT/US12/36969 filed May 8, 2012, and claims the benefit of priority of that international application.

FIELD

Embodiments of the invention are generally related to power management, and more particularly to adaptively providing input voltage based on a load device profile.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright © 2012, Intel Corporation, All Rights Reserved.

BACKGROUND

As electronic circuits shrink, and as devices become smaller and more portable, voltage levels used by the electronics have decreased. While the use of lower operating voltages is applied to many electronic components, memory devices typically require higher voltages for data storage, retention, and access than is currently used for other components. For example, DRAMs (dynamic random access memories) internally produce a Vpp supply using charge pumps. The Vpp supply is used in word line boosting, and is considered essential for fundamental DRAM data storage, retention, and access. However, the efficiency of charge pumps has traditionally been low, and has been steadily declining with process technology migration.

More modern memory implementations, such as DDR4 (dual data rate version 4) addresses decreasing charge pump inefficiency by setting a somewhat higher input voltage to the DRAM devices than the voltage of typical electronic devices. JEDEC (Joint Electronic Device Engineering Council) has standardized 2.5 V as a standard input voltage from an external source to the memory devices. With the 2.5 V input voltage to the memory devices, the charge pumps are not required to step up the voltage as high as if the voltage were down at around 1.0-1.5 V as with many electronic circuits. However, even with the input voltage standardized at 2.5 V, the charge pumps are inefficient, and thus the source of a significant amount of power use in a system that uses memory devices.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Descriptions of certain details and implementations follow, including a description of the figures, which may depict some or all of the embodiments described below, as well as discussing other potential embodiments or implementations of the inventive concepts presented herein.

DETAILED DESCRIPTION

As described herein, an adaptive voltage regulation system provides a voltage based on a power profile of a load device. In one embodiment, a memory subsystem with an adaptive output voltage can provide a voltage to a memory device based on a power profile of the memory device. A charge pump increases the voltage to a level needed for data storage, access, and/or retention operations by the memory device. The voltage provided to the charge pump based on the power profile of the memory device, which indicates a voltage level that provides good efficiency for the charge pump, and is within maximum levels for the memory device. The voltage can be higher than a nominal input voltage indicated for the memory device in a specification.

The adaptive voltage provided herein enables the charge pump to operate at a higher efficiency than simply using a nominal voltage level as indicated by the standard. The system power control (such as part of a power management component) can provide an adaptive voltage that is closer to the target voltage output of the charge pump, thus requiring less work for the charge pump to step up the voltage. Voltage regulation to the adaptive voltage level is more efficient than regulating the voltage down even further, and then stepping it back up with a charge pump. Thus, the overall system power consumption is less.

As a more specific example, consider the JEDEC standard for DRAM that specifies a voltage of 2.5 V to be supplied to the memory devices. Some devices can only tolerate a 2.5 V input voltage, while others can tolerate higher voltages (such as 3.3 V). Some devices nominally support a voltage, but can actually operate at a slightly higher voltage (i.e., within a tolerance amount). Charge pumps are typically designed to handle input voltages above the specification tolerance specification, as long as the input voltage is less than the internally pumped up voltage. The adaptive voltage generation herein can provide an input voltage level that is specific to the memory device characteristics.

Figure 1:
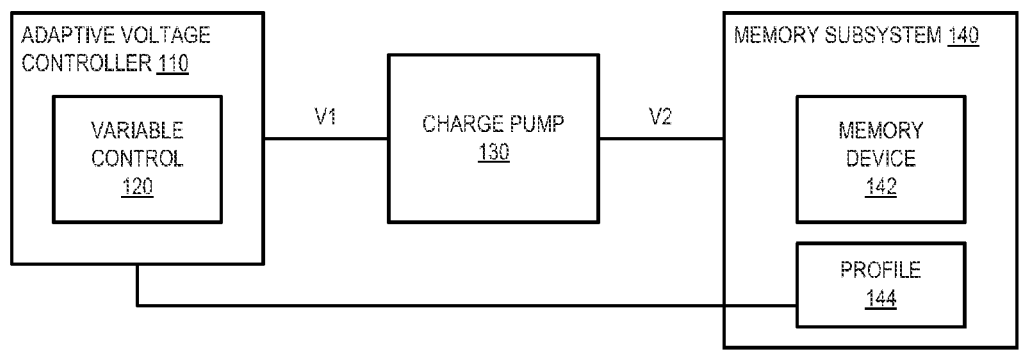
FIG. 1 is a block diagram of an embodiment of a system that provides adaptive voltage to a charge pump based on a load profile.

FIG. 1 is a block diagram of an embodiment of a system that provides adaptive voltage to a charge pump based on a load profile. System 100 is a computing device that includes memory subsystem 140. Memory subsystem 140 includes one or more memory devices 142, such as a DRAM device (any form of dynamic random access memory device). Adaptive voltage controller 110 provides voltage at level V1 to charge pump 130, which can step up the voltage to level V2 to provide to memory subsystem 140.

In one embodiment, memory subsystem 140 includes a storage device, such as a register (e.g., a mode register) or a fuse bank, which includes profile information 144 for memory device 142. The profile is typically the same for all memory devices of each memory module of memory subsystem 140. In one embodiment, profile information 144 indicates a voltage maximum for memory device 142. In one embodiment, profile information 144 indicates an optimum Vpp, or a value for Vpp that is used by memory device 142 to perform its data operations. In one embodiment, profile information 144 is a value or multiple values that are used to digitally control variable control 120 of controller 110.

In one embodiment, controller 110 can provide the optimum Vpp, which means charge pump 130 is not required, since V1 would equal V2. However, even if an ideal Vpp cannot be provided by controller 110, if controller 110 provides a voltage that is higher than a nominal voltage, there will still be significant savings in efficiency. In one embodiment, V1 is set to a value as close to an internal Vpp requirement as possible, but still above a JEDEC specification value, for example.

Controller 110 accesses profile information 144 to determine where to set V1. In one embodiment, profile information 144 is not stored with the memory device, but in a BIOS (basic input/output system) of system 100 (not specifically shown). For example, the BIOS can include a list of devices with accompanying values to set the memory subsystem input voltage, or can access such a list. In such an embodiment, controller 110 can access memory device 142 to identify what memory device it is, and then access the BIOS to determine what values to use to set V1 for that particular, identified device.

By providing V1 as an adaptive voltage based on profile 144 for memory device 142, system 100 can have significant power savings. In one simulation, activation power savings were approximately 5%, self-refresh power savings were approximately 10%, and auto-refresh power savings were approximately 20%. It will be understood that the savings is dependent on the type of memory device and the configuration of the system, but it is expected that a 10% overall power savings is possible.

Figure 2:
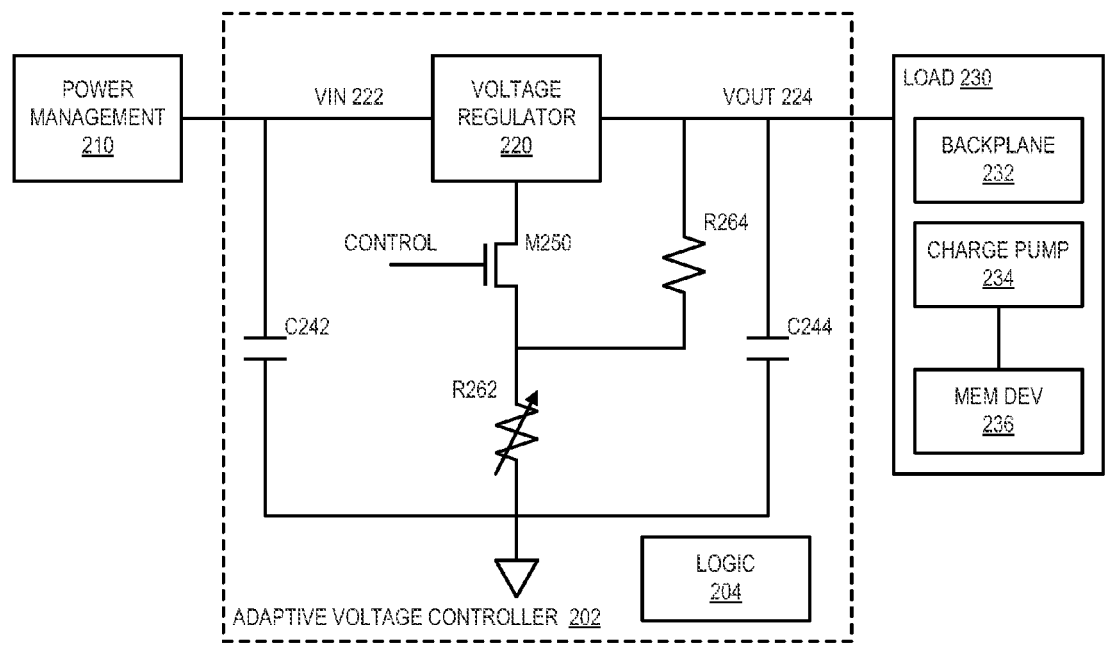
FIG. 2 is a block diagram of an embodiment of an adaptive voltage controller.

FIG. 2 is a block diagram of an embodiment of an adaptive voltage controller. System 200 includes adaptive voltage controller 202, which is one example of an adaptive voltage controller according to any embodiment described herein. In one embodiment, controller 202 provides a maximum Vout 224 that can be received by load 230, to provide increased efficiency in charge pump 234.

Power management 210 represents components of a power management subsystem in system 200. Power management 210 generally manages the distribution of power in system 200. In system 200, there is a voltage, Vin, that is higher than the voltage needed by a memory subsystem of system 200. Such a voltage is regulated down to Vout 224. As described herein, Vout 224 can be produced adaptively to a voltage level for load 230 (which includes memory device 236 of a memory subsystem), based on a power profile of the load.

In one embodiment, controller 202 includes capacitor C242 to hold the input at Vin 222, and thus smooth the input voltage. In one embodiment, C242 is not considered part of controller 202. Similarly, capacitor C244 smoothes Vout 224, and may or may not be considered part of controller 202.

Voltage regulator 220 comprises a voltage regulator as known in the art, which takes Vin 222 at one level, and regulates the voltage down to a lower Vout 224. The level of Vout 224 is dependent on the adaptive voltage control of controller 202. The adaptive voltage control is provided by the logic 204, in conjunction with the other elements of controller 202. Logic 204 generically represents logic to drive M250 (i.e., the input "CONTROL" to M250). M250 is switched on and off based on the power profile of memory device 236, to control the output at Vout 224.

R262 is illustrated as a variable resistor. The illustration as a variable resistor can be understood somewhat redundant, given that the variability of R262 can be provided by the switching action of M250. Thus, M250 is switched on and off at a relatively high speed (e.g., kHz speed). Resistor R264 provides a feedback control from Vout 224 to maintain the desired output voltage. Thus, in one embodiment, the adaptive voltage supply includes a variable voltage divider, which can include a digitally controlled voltage level.

It will be understood that controller 202 accesses a power profile (not specifically shown) of memory device 236 and bases Vout 224 on the power profile of the memory device. In one embodiment, the profile of memory device 236 includes the platform connection that couples the memory device to the system. Thus, in one embodiment, backplane 232 can be part of load 230. Backplane 232 refers to connectors, copper plane characteristics, or other contacts that can affect a capacitive or inductive characteristic of load 230. The capacitive and inductive characteristics of load 230 can be referred to as the reactive or complex component of the power profile.

Controller 202 can attempt to maximize Vout 224 based on the power profile of memory device 236 (including the backplane and/or other components affecting the reactive component of the power profile). By setting Vout 224 to the maximum voltage permitted for memory device 236, charge pump 234 is not required to step up the voltage as much, which increases the efficiency of the charge pump. Charge pumps are primarily inefficient because of the energy required to switch the charging capacitors (not shown) from series to parallel by a modulated switching signal, as is understood in the art. Charge pumps have a feedback loop mechanism that regulates the output voltage by modulating the pump duty cycle. The duty cycle of the charge pump can be reduced when the step needed to be provided by the charge pump is reduced, which increases the efficiency of the charge pump.

However, increasing Vout 224 (which is the input voltage to the memory device and its charge pump) to the maximum level allowed for memory device 236 runs the risk of having a reactive kickback in power transitions, which reactive kickback could then exceed the allowable input voltage to the memory device, resulting in damage to the memory device. Thus, in one embodiment, controller 202 computes a value for Vout 224 (e.g., with logic 204) based on a maximum input voltage level for memory device 236, including calculating a tolerance. The tolerance can be based on a set percentage, or can be calculated specifically for a device based on a reactive component of its power profile.

Thus, an adaptive voltage supply can provide a voltage to memory device 236 at a level higher than a nominal voltage level indicated by a specification. The higher voltage level can include a tolerance amount lower than the maximum voltage threshold for the memory device. Additionally, in one embodiment the tolerance amount can be computed based on a reactive component of the power profile for the memory device.

In one embodiment, controller 202 creates a voltage divider with variable resistor R262 and R264, and adjusts the Vout 224 based on the specific power characteristics of memory device 236. In one embodiment, logic 204 includes a DAC (digital to analog converter) that generates a signal used to control the voltage divider. The DAC can respond to a code that indicates the power profile of memory device 236. For example, adaptive control can be provided with an 8-bit DAC that has 0.1 mV granularity per bit.

It will be understood that power profile information is predetermined, or calculated a priori to system operation with the memory device. Consider a memory device that is tested at 2.5 V to determine what current is needed for the memory device. The system can then calculate the real and reactive components for the load conditions. Based on the computations, specific voltage output can be provided by controller 202 to load 230. In one embodiment, the system sets values for a DAC based on the computations. The DAC values can indicate a current profile indicating a number of amps needed for the memory device. In one embodiment, the power profile includes minimum and maximum values for an associated memory device.

Figure 3:
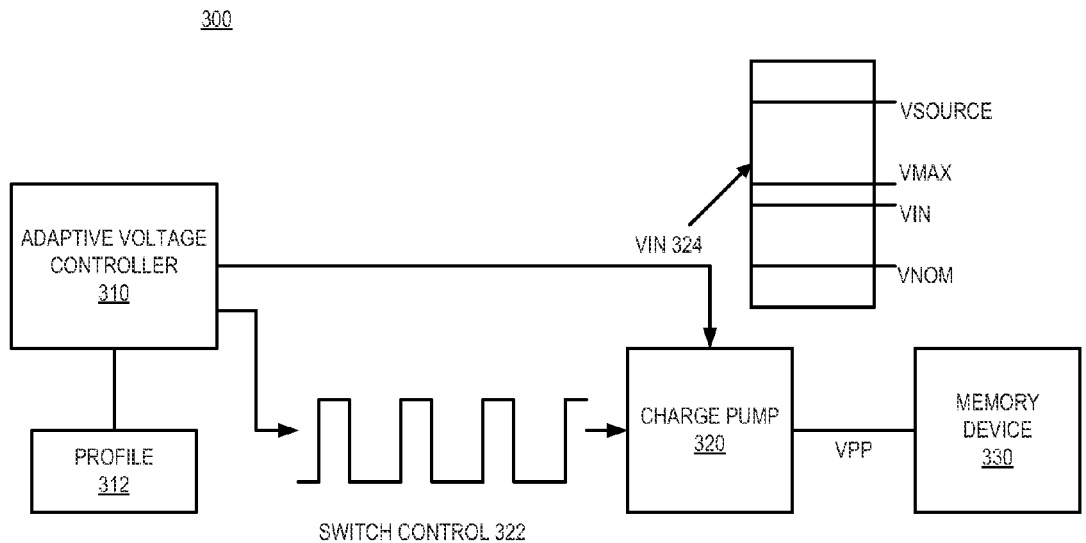
FIG. 3 is a block diagram of an embodiment of a system that provides an input voltage based on a load profile.

FIG. 3 is a block diagram of an embodiment of a system that provides an input voltage based on a load profile. System 300 provides one example of adaptive voltage control in accordance with any embodiment described herein. More specifically, adaptive voltage controller 310 provides Vin 324 to charge pump 320, where the voltage level of Vin 324 is based on profile 312. Profile 312 is a power profile for memory device 330. Controller 310 is an adaptive voltage supply according to any embodiment described herein.

Controller 310 determines from profile 312 what level to set the voltage provided to memory device 330 (Vin 324). A comparison of voltage levels is shown for purposes of representation. The levels are not to be understood as necessarily to scale. Vsource is a source voltage that can be provided to a voltage regulator of controller 310. Vmax is the maximum voltage level of memory device 330. In one embodiment, profile 312 indicates Vmax. Indicating Vmax can include providing a value that identifies Vmax, or can include providing a value used by controller 310 to set Vin 324 to a level based on Vmax.

Vin represents a target level for Vin 324. Vin can be equal to or less than Vmax. In one embodiment there is a tolerance between Vmax and Vin. Vnom is a nominal voltage indicated by a specification for memory device 330. Traditional systems set Vin 324 to Vnom as indicated by a specification, whereas the system described herein allows setting a voltage level based on the characteristics of memory device 330.

Assume that Vin 324 (the input voltage to charge pump 320) is standardized to be 2.5 V+10%/−5%, based on a specification for systems using memory device 330. Thus, Vnom would be 2.5 V. Vin could be set to 2.5 V+10%, which would keep the input voltage within the overall specification. However, with input voltage raised to 2.75 V, the duty cycle of charge pump 320 can be reduced approximately 10% (corresponding to the 10% increase in voltage level). The power savings can be compounded when considering that each memory device (e.g., each DRAM unit) has its own charge pump. Given that an internal Vpp supply is used by each memory device for data retention and data access, each memory device of a multi-device memory subsystem can save the same approximately 10% power. The power savings translate to longer battery life, for example, for mobile platforms, handheld devices, mobile phones, or other devices.

When they are using an input voltage higher than the specification indicates, they have to pick a value that is based on what a device can tolerate. They can skew close to the maximum without having it go over. The advantage here is that they can adjust the voltage specifically for a particular device.

In one embodiment, switch control 322 represents a duty cycle of a switch of charge pump 320. In one embodiment, the duty cycle of the charge pump switch is set lower based on Vin 324 being set higher than a nominal voltage. It will be understood that setting the duty cycle lower refers to setting the duty cycle lower than it would be if Vnom was used as the input voltage to charge pump 320.

Figure 4:
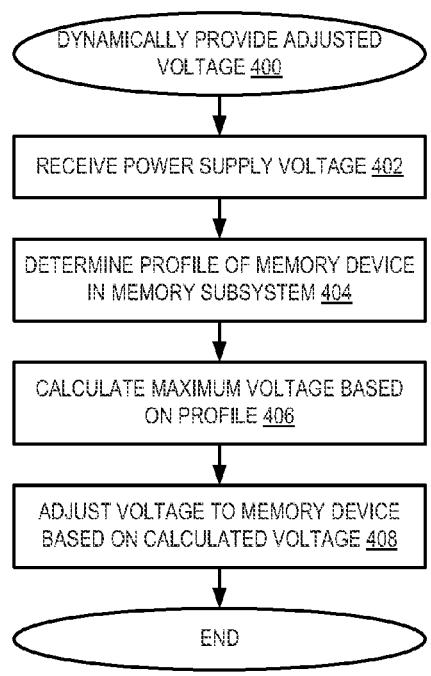
FIG. 4 is a flow diagram of an embodiment of a process for dynamically providing an adjusted voltage to a charge pump.

FIG. 4 is a flow diagram of an embodiment of a process for dynamically providing an adjusted voltage to a charge pump. Process 400 is a process for dynamically or adaptively providing an adjusted voltage. The adaptive voltage supply or controller receives a voltage from a power supply, 402. The power supply voltage is to be regulated down to a level to provide to the memory subsystem of the system.

The controller determines a profile of the memory device of the memory subsystem, 404. The controller reads the profile as described above, from the memory device itself, from a BIOS, or other register or memory. In one embodiment, the controller calculates a maximum voltage based on the profile, 406, which can include computing a reactive component to the power profile of the memory device. In one embodiment, the power profile information indicates a maximum voltage level for the storage device, and the controller computes a level to set the voltage input to the memory device and its charge pump. The controller adjusts its output voltage (the input voltage to the charge pump) based on the calculated voltage level, 408.

Figure 5:
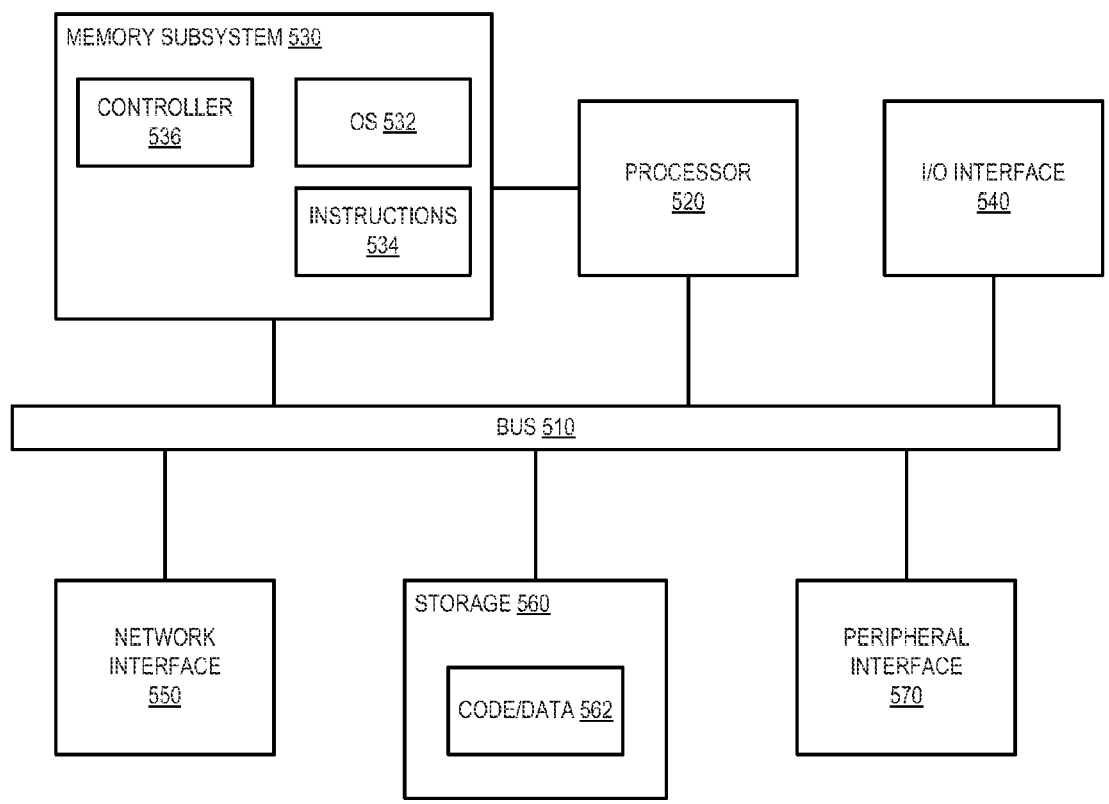
FIG. 5 is a block diagram of an embodiment of a computing system in which an adaptive voltage for a charge pump can be used.

FIG. 5 is a block diagram of an embodiment of a computing system in which an adaptive voltage for a charge pump can be used. System 500 represents a computing device in accordance with any embodiment described herein, and can be a laptop computer, a desktop computer, a server, a gaming or entertainment control system, a scanner, copier, printer, or other electronic device. System 500 includes processor 520, which provides processing, operation management, and execution of instructions for system 500. Processor 520 can include any type of microprocessor, central processing unit (CPU), processing core, or other processing hardware to provide processing for system 500. Processor 520 controls the overall operation of system 500, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 530 represents the main memory of system 500, and provides temporary storage for code to be executed by processor 520, or data values to be used in executing a routine. Memory subsystem 530 can include one or more memory devices such as read-only memory (ROM), flash memory, one or more varieties of random access memory (RAM), or other memory devices, or a combination of such devices. Memory subsystem 530 stores and hosts, among other things, operating system (OS) 532 to provide a software platform for execution of instructions in system 500. Additionally, other instructions 534 are stored and executed from memory subsystem 530 to provide the logic and the processing of system 500. OS 532 and instructions 534 are executed by processor 520.

Memory subsystem 530 includes controller 536, which is an adaptive voltage controller in accordance with any embodiment described herein, and which manages providing a voltage based on a power profile of the memory devices of memory subsystem 530. Controller 536 reads a power profile of the memory device, and adjusts the operation of a variable voltage supply based on the profile.

Processor 520 and memory subsystem 530 are coupled to bus/bus system 510. Bus 510 is an abstraction that represents any one or more separate physical buses, communication lines/interfaces, and/or point-to-point connections, connected by appropriate bridges, adapters, and/or controllers. Therefore, bus 510 can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 510 can also correspond to interfaces in network interface 550.

System 500 also includes one or more input/output (I/O) interface(s) 540, network interface 550, one or more internal mass storage device(s) 560, and peripheral interface 570 coupled to bus 510. I/O interface 540 can include one or more interface components through which a user interacts with system 500 (e.g., video, audio, and/or alphanumeric interfacing). Network interface 550 provides system 500 the ability to communicate with remote devices (e.g., servers, other computing devices) over one or more networks. Network interface 550 can include an Ethernet adapter, wireless interconnection components, USB (universal serial bus), or other wired or wireless standards-based or proprietary interfaces.

Storage 560 can be or include any conventional medium for storing large amounts of data in a nonvolatile manner, such as one or more magnetic, solid state, or optical based disks, or a combination. Storage 560 holds code or instructions and data 562 in a persistent state (i.e., the value is retained despite interruption of power to system 500). Storage 560 can be generically considered to be a "memory," although memory 530 is the executing or operating memory to provide instructions to processor 520. Whereas storage 560 is nonvolatile, memory 530 can include volatile memory (i.e., the value or state of the data is indeterminate if power is interrupted to system 500).

Peripheral interface 570 can include any hardware interface not specifically mentioned above. Peripherals refer generally to devices that connect dependently to system 500. A dependent connection is one where system 500 provides the software and/or hardware platform on which operation executes, and with which a user interacts.

Figure 6:
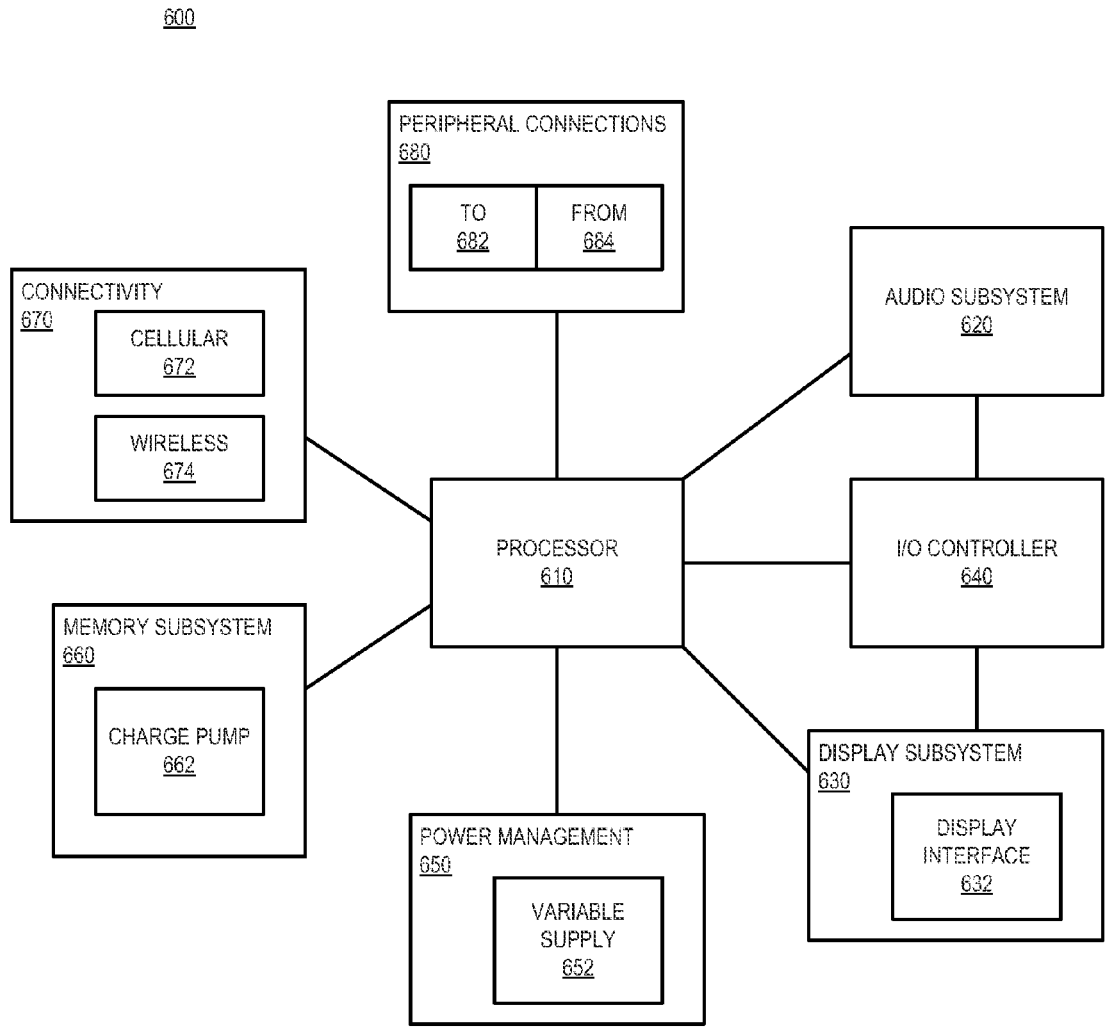
FIG. 6 is a block diagram of an embodiment of a mobile device in which an adaptive voltage for a charge pump can be used.

FIG. 6 is a block diagram of an embodiment of a mobile device in which an adaptive voltage for a charge pump can be used. Device 600 represents a mobile computing device, such as a computing tablet, a mobile phone or smartphone, a wireless-enabled e-reader, or other mobile device. It will be understood that certain of the components are shown generally, and not all components of such a device are shown in device 600.

Device 600 includes processor 610, which performs the primary processing operations of device 600. Processor 610 can include one or more physical devices, such as microprocessors, application processors, microcontrollers, programmable logic devices, or other processing means. In one embodiment, processor 610 includes optical interface components in addition to a processor die. Thus, the processor die and photonic components are in the same package. Such a processor package can interface optically with an optical connector in accordance with any embodiment described herein.

The processing operations performed by processor 610 include the execution of an operating platform or operating system on which applications and/or device functions are executed. The processing operations include operations related to I/O (input/output) with a human user or with other devices, operations related to power management, and/or operations related to connecting device 600 to another device. The processing operations can also include operations related to audio I/O and/or display I/O.

In one embodiment, device 600 includes audio subsystem 620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 600, or connected to device 600. In one embodiment, a user interacts with device 600 by providing audio commands that are received and processed by processor 610.

Display subsystem 630 represents hardware (e.g., display devices) and software (e.g., drivers) components that provide a visual and/or tactile display for a user to interact with the computing device. Display subsystem 630 includes display interface 632, which includes the particular screen or hardware device used to provide a display to a user. In one embodiment, display interface 632 includes logic separate from processor 610 to perform at least some processing related to the display. In one embodiment, display subsystem 630 includes a touchscreen device that provides both output and input to a user.

I/O controller 640 represents hardware devices and software components related to interaction with a user. I/O controller 640 can operate to manage hardware that is part of audio subsystem 620 and/or display subsystem 630. Additionally, I/O controller 640 illustrates a connection point for additional devices that connect to device 600 through which a user might interact with the system. For example, devices that can be attached to device 600 might include microphone devices, speaker or stereo systems, video systems or other display device, keyboard or keypad devices, or other I/O devices for use with specific applications such as card readers or other devices.

As mentioned above, I/O controller 640 can interact with audio subsystem 620 and/or display subsystem 630. For example, input through a microphone or other audio device can provide input or commands for one or more applications or functions of device 600. Additionally, audio output can be provided instead of or in addition to display output. In another example, if display subsystem includes a touchscreen, the display device also acts as an input device, which can be at least partially managed by I/O controller 640. There can also be additional buttons or switches on device 600 to provide I/O functions managed by I/O controller 640.

In one embodiment, I/O controller 640 manages devices such as accelerometers, cameras, light sensors or other environmental sensors, gyroscopes, global positioning system (GPS), or other hardware that can be included in device 600. The input can be part of direct user interaction, as well as providing environmental input to the system to influence its operations (such as filtering for noise, adjusting displays for brightness detection, applying a flash for a camera, or other features).

In one embodiment, device 600 includes power management 650 that manages battery power usage, charging of the battery, and features related to power saving operation. Memory subsystem 660 includes memory devices for storing information in device 600. Memory can include nonvolatile (state does not change if power to the memory device is interrupted) and/or volatile (state is indeterminate if power to the memory device is interrupted) memory devices. Memory 660 can store application data, user data, music, photos, documents, or other data, as well as system data (whether long-term or temporary) related to the execution of the applications and functions of system 600.

In one embodiment, power management 650 includes variable voltage supply 652 to provide an adaptive voltage to memory devices of memory subsystem 660 based on a power profile of the memory devices. In one embodiment, variable voltage supply 652 is part of memory subsystem 660. In one embodiment, memory subsystem 660 includes charge pump 662. The operation of charge pump 662 can be affected by the output of variable voltage supply 652. For example, the charge pump can adjust a duty cycle of a switch based on receiving a higher input voltage from adaptive voltage supply 652.

Connectivity 670 includes hardware devices (e.g., wireless and/or wired connectors and communication hardware) and software components (e.g., drivers, protocol stacks) to enable device 600 to communicate with external devices. The device could be separate devices, such as other computing devices, wireless access points or base stations, as well as peripherals such as headsets, printers, or other devices.

Connectivity 670 can include multiple different types of connectivity. To generalize, device 600 is illustrated with cellular connectivity 672 and wireless connectivity 674. Cellular connectivity 772 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 674 refers to wireless connectivity that is not cellular, and can include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 680 include hardware interfaces and connectors, as well as software components (e.g., drivers, protocol stacks) to make peripheral connections. It will be understood that device 600 could both be a peripheral device ("to" 682) to other computing devices, as well as have peripheral devices ("from" 684) connected to it. Device 600 commonly has a "docking" connector to connect to other computing devices for purposes such as managing (e.g., downloading and/or uploading, changing, synchronizing) content on device 600. Additionally, a docking connector can allow device 600 to connect to certain peripherals that allow device 600 to control content output, for example, to audiovisual or other systems.

In addition to a proprietary docking connector or other proprietary connection hardware, device 600 can make peripheral connections 680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

In one aspect, a memory subsystem includes a memory device to store data, a charge pump, and an adaptive voltage supply. The memory device is to receive an input voltage at a first voltage level, but uses a second voltage, higher than the first voltage, to write data to the memory device. The charge pump is to increase the input voltage from the first voltage level to the second voltage level. The adaptive voltage supply is to provide the first voltage level based on a power profile of the memory device, the power profile indicating a maximum input voltage level for the memory device.

In one embodiment, the memory device is a dynamic random access memory (DRAM) device. In one embodiment, the charge pump is to lower a duty cycle of a switch based on the first voltage level. In one embodiment, the adaptive voltage supply is to provide the first voltage at a level higher than a nominal voltage level indicated by a specification for the memory device. In one embodiment, the first voltage is a tolerance amount lower than the maximum voltage level for the memory device. In one embodiment, the tolerance amount is computed based on a reactive component of the power profile for the memory device.

In one embodiment, the adaptive voltage supply includes a variable voltage divider. In one embodiment, the adaptive voltage supply further includes a digitally controlled voltage level. In one embodiment, the adaptive voltage supply further includes a digital to analog converter.

In one aspect, an electronic device includes a memory subsystem including a memory device to store data, a charge pump, an adaptive voltage supply, and a multicore processor coupled to the memory subsystem to access the memory subsystem during execution of the processor. The memory device is to receive an input voltage at a first voltage level, but uses a second voltage, higher than the first voltage, to write data to the memory device. The charge pump is to increase the input voltage from the first voltage level to the second voltage level. The adaptive voltage supply is to provide the first voltage level based on a power profile of the memory device, the power profile indicating a maximum input voltage level for the memory device.

In one aspect, a method includes operations including receiving an input voltage at a voltage regulator, determining a power profile of a memory device coupled to the voltage regulator, adjusting an output voltage of the voltage regulator based on the power profile, and providing the adjusted output voltage to a charge pump of the memory device, wherein the charge pump is to increase the output voltage to a stepped-up voltage level used for writing data to the memory device.

In one embodiment, the method can further include decreasing a duty cycle of a switch of the charge pump based on the adjusted output voltage. In one embodiment, the adjusting the output voltage can include adjusting the voltage to a level higher than a nominal voltage level indicated by a specification for the memory device, and a tolerance amount lower than the maximum voltage level for the memory device. In one embodiment, the method includes computing the tolerance amount based on a reactive component of the power profile for the memory device.

In one embodiment, the method includes digitally controlling the voltage level based on a value indicated in the power profile. In one embodiment, the method includes digitally controlling the voltage level, which can include the use of a digital to analog converter to adjust the output voltage.

Flow diagrams as illustrated herein provide examples of sequences of various process actions. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A memory subsystem comprising:
    a memory device to store data, the memory device to receive an input voltage at a first voltage level, wherein data is written to the memory device using a second voltage level that is higher than the first voltage level;
    a charge pump to increase the input voltage from the first voltage level to the second voltage level; and
    an adaptive voltage supply to provide the first voltage level based on a power profile of the memory device, the power profile indicating a maximum input voltage level for the memory device, wherein the adaptive voltage supply is to provide the first voltage level at a level that is higher than a nominal voltage level indicated by a specification for the memory device, the adaptive voltage supply further comprising a digitally controlled variable voltage divider.

2. The memory subsystem of claim 1, wherein the memory device comprises a dynamic random access memory (DRAM) device.

3. The memory subsystem of claim 1, wherein the charge pump is to lower a duty cycle of a switch based on the first voltage level.

4. The memory subsystem of claim 1, wherein the first voltage level at the level higher than the nominal voltage level comprises a voltage level that is a tolerance amount lower than the maximum voltage level for the memory device.

5. The memory subsystem of claim 4, wherein the tolerance amount comprises a tolerance amount computed based on a reactive component of the power profile for the memory device.

6. The memory subsystem of claim 1, wherein the adaptive voltage supply further comprises a digital to analog converter.

7. An electronic device comprising:
    a memory subsystem comprising:
        a memory device to store data, the memory device to receive an input voltage at a first voltage level, wherein writing data to the memory device uses a second voltage level that is higher than the first voltage level;
        a charge pump to increase the input voltage from the first voltage level to the second voltage level; and
        an adaptive voltage supply to provide the first voltage level based on a power profile of the memory device, the power profile indicating a maximum input voltage level for the memory device, wherein the adaptive voltage supply is to provide the first voltage level at a level that is higher than a nominal voltage level indicated by a specification for the memory device, the higher level being a voltage level that is a tolerance amount lower than the maximum input voltage for the memory device, wherein the adaptive voltage supply further comprises a digitally controlled variable voltage divider; and
    a multicore processor coupled to the memory subsystem to access the memory subsystem during execution of the processor.

8. The device of claim 7, wherein the memory device comprises a dynamic random access memory (DRAM) device.

9. The device of claim 7, wherein the charge pump is to lower a duty cycle of a switch based on the first voltage level.

10. The device of claim 7, wherein the tolerance amount comprises a tolerance amount computed based on a reactive component of the power profile for the memory device.

11. A method comprising:
    receiving an input voltage at a voltage regulator;
    determining a power profile of a memory device coupled to the voltage regulator;
    adjusting an output voltage of the voltage regulator based on the power profile, wherein adjusting the output voltage comprises adjusting the output voltage to a level higher than a nominal voltage level indicated by a specification for the memory device, and a tolerance amount lower than the maximum voltage level for the memory device and wherein adjusting the output voltage of the voltage regulator further comprises digitally controlling a variable voltage divider that produces a voltage that is coupled to said voltage regulator; and
    providing the adjusted output voltage to a charge pump of the memory device, wherein the charge pump is to increase the output voltage to a stepped-up voltage level used for writing data to the memory device.

12. The method of claim 11, further comprising decreasing a duty cycle of a switch of the charge pump based on the adjusted output voltage.

13. The method of claim 11, wherein adjusting the output voltage further comprises computing the tolerance amount based on a reactive component of the power profile for the memory device.

14. The method of claim 11, wherein adjusting the output voltage level further comprises digitally controlling the voltage level.

15. The method of claim 14, wherein digitally controlling the voltage level further comprises generating a digital signal to control a digital to analog converter to adjust the output voltage.

16. An apparatus, comprising:
a variable voltage control circuit comprising:
an input to receive profile information concerning a voltage level of a memory device;
an output to provide a first voltage to a charge pump based on the profile information, the charge pump to pump the first voltage to a higher voltage for the memory device, the first voltage being higher than a nominal voltage level indicated by a specification for the memory device;
a digitally controlled variable voltage divider.

17. The apparatus of claim 16 further comprising circuitry to determine the first voltage.

18. The apparatus of claim 16 wherein the first voltage is just below the higher voltage.

19. The apparatus of claim 16 wherein the information identifies a maximum voltage level of the memory device.

20. The apparatus of claim 16 wherein the information identifies the higher level voltage.

21. The apparatus of claim 16 wherein the specification is a JEDEC specification.

22. The apparatus of claim 16 wherein the input is to be coupled to one of:
the memory device;
a BIOS circuit.

* * * * *